(12) United States Patent
Matsuoka et al.

(10) Patent No.: US 7,341,892 B2
(45) Date of Patent: Mar. 11, 2008

(54) SEMICONDUCTOR MEMORY CELL AND METHOD OF FORMING SAME

(75) Inventors: Hideyuki Matsuoka, Nishitokyo (JP); Kiyoo Itoh, Higashikurume (JP); Motoyasu Terao, Hinode (JP); Satoru Hanzawa, Hachioji (JP); Takeshi Sakata, Hino (JP)

(73) Assignee: Hitachi, Ltd., Tokyo (JP)

( * ) Notice: Subject to any disclaimer, the term of this patent is extended or adjusted under 35 U.S.C. 154(b) by 164 days.

(21) Appl. No.: 11/368,603

(22) Filed: Mar. 7, 2006

(65) Prior Publication Data

US 2006/0148135 A1 Jul. 6, 2006

Related U.S. Application Data

(63) Continuation of application No. 10/876,461, filed on Jun. 28, 2004, now Pat. No. 7,078,273, which is a continuation of application No. 10/808,510, filed on Mar. 25, 2004, now Pat. No. 6,946,704, which is a continuation of application No. 10/307,373, filed on Dec. 2, 2002, now Pat. No. 6,740,921.

(30) Foreign Application Priority Data

Feb. 1, 2002 (JP) .............................. 2002-024918

(51) Int. Cl.
*H01L 21/82* (2006.01)
(52) U.S. Cl. ...................................... 438/128; 257/530
(58) Field of Classification Search .................. 438/95, 438/128, 130, 131; 257/4, 32, 530, E31.029
See application file for complete search history.

(56) References Cited

U.S. PATENT DOCUMENTS

| | | | |
|---|---|---|---|
| 4,599,705 A | 7/1986 | Holmberg et al. |
| 4,845,533 A | 7/1989 | Pryor et al. |
| 5,032,538 A | 7/1991 | Bozler et al. |
| 5,920,788 A | 7/1999 | Reinberg |
| 6,087,674 A | 7/2000 | Ovshinsky et al. |
| 6,429,449 B1 | 8/2002 | Gonzalez et al. |
| 6,437,383 B1 | 8/2002 | Xu et al. |
| 6,737,312 B2 | 5/2004 | Moore |

FOREIGN PATENT DOCUMENTS

| | | |
|---|---|---|
| JP | 56-100464 | 12/1980 |
| JP | 5-121693 | 10/1991 |

OTHER PUBLICATIONS

Stefan Lai, Tyler Lowrey, "OUM—A 180 nm Nonvolatile Memory Cell Element Technology For Stand Alone and Embedded Applications", 2001, IEDM Technical Digest Paper, pp. 36.5.

*Primary Examiner*—David Vu
(74) *Attorney, Agent, or Firm*—Reed Smith LLP; Stanley P. Fisher, Esq.; Juan Carlos A. Marquez, Esq.

(57) ABSTRACT

A semiconductor memory cell and forming method thereof utilizes a vertical select transistor to eliminate the problem of a large cell surface area in memory cells of the related art utilizing phase changes. A memory cell with a smaller surface area than the DRAM device of the related art is achieved by the present invention. Besides low power consumption during read operation, the invention also provides phase change memory having low power consumption even during write operation. Phase change memory also has stable read-out operation.

6 Claims, 16 Drawing Sheets

SEMICONDUCTOR MEMORY CELL AND METHOD OF FORMING SAME

This application is a Continuation application of U.S. application Ser. No. 10/876,461 filed Jun. 28, 2004, now U.S. Pat. No. 7,078,273, which is a Continuation application of U.S. application Ser. No. 10/808,510 filed Mar. 25, 2004, now U.S. Pat. No. 6,946,704, which is a Continuation application of U.S. application Ser. No. 10/307,373 filed Dec. 2, 2002. Priority is claimed based on U.S. application Ser. No. 10/876,461 filed Jun. 28, 2004, which claims the priority of U.S. application Ser. No. 10/808,510 filed Mar. 25, 2004, which claims the priority of U.S. application Ser. No. 10/307,373 filed Dec. 2, 2002, now U.S. Pat. No. 6,740,921, which claims the priority date of Japanese Patent Application No. 2002-024918 filed Feb. 1, 2002.

BACKGROUND OF THE INVENTION

1. Field of the Invention

The present invention relates to a semiconductor memory cell and more particularly to a random access memory (RAM) with high-speed, low-voltage operation that is also nonvolatile.

2. Description of Related Art

The nonvolatile memory market has undergone amazing expansion driven by the demand for mobile devices typified by cellular telephones. The flash memory is a typical nonvolatile memory but basically has a slow operating speed so is utilized as a programmable ROM (Read-Only-Memory). However a high speed DRAM (Dynamic RAM) is required as a work memory. Both a flash and DRAM are contained in the cellular telephone memory. If a device could be achieved having the characteristics of these two memories, then not only could a flash and DRAM be mounted on the same chip but all semiconductor memories could be replaced to render an extremely large impact.

One memory of this type, a memory utilizing phase changes (OUM: Ovonic Unified Memory) was proposed by the Intel Corporation at the 2001 IEDM (International Electron Device Meeting).

The operating principle of this memory is simply described as follows. The OUM utilizes a material called chalcogenide as a memory node to store different resistance values according to the state of crystallization. Chalcogenide is a material utilized as a medium in DVD and CDs. This is typically in the form of alloys such as Ag—In—Sb—Te or Ge—Sb—Te containing at least antimony (Sb) and tellurium (Te). A basic memory cell is composed of a select transistor and chalcogenide, and resembles the so-called DRAM cell. The chalcogenide can be regarded as a substitute for the capacitor. The crystallized state of the chalcogenide is monocrystalline or amorphous and the difference in resistance value varies from 10 to 10,000 times. A solid state memory can be obtained by utilizing this difference. In the case of the MRAM (Magnetic Ram) gaining much recent attention as a nonvolatile memory, the rate of change in resistance is about 40 percent. The OUM can therefore easily perform much greater sensing than the MRAM.

The Joule heat generated by applying a voltage is utilized to change the crystallization state of the chalcogenide. In the amorphous state, the chalcogenide is heated to approximately 600 degrees Centigrade to melt it and then quickly cools. In the crystallized state, a temperature of 400 degrees Centigrade is maintained for about 50 nanoseconds. A pulse as shown in FIG. 2 is therefore applied to write data. To read data, the word line is set to on, and information of two values ("0", "1") is identified by the current flow (between the common ground and bit line) The phase changing (Ovonic) memory described above comprising a select transistor and chalcogenide has a cell surface area of approximately $8F^2$ or more. The value F here denotes the minimum processing dimensions. The problem therefore exists that in order to increase its capacity, the memory cell surface area must be reduced even further.

SUMMARY OF THE INVENTION

To resolve the aforementioned problems with the present invention, the present invention has the object of providing a memory cell structure and forming method for that memory cell utilizing a vertical transistor and capable of achieving a memory cell with a surface area of $4F^2$. A typical memory cell structure of the present invention is shown in FIG. 1. The memory cell structure in the figure, from the top on downwards is composed of a first wiring layer (7) for reading and writing, a vertical select transistor (1) electrically connected to that wiring layer, a chalcogenide material (2) above it for accumulating information, and a second wiring layer (8) for reading and writing on the chalcogenide material. The flat layout of the memory cell of the invention is shown in FIG. 3. The cell wiring layer (803) and the word line (403) are formed at a minimum pitch 2F so the memory cell surface area is $4F^2$.

DETAILED DESCRIPTION OF THE PREFERRED EMBODIMENTS

First Embodiment

Figure 1:
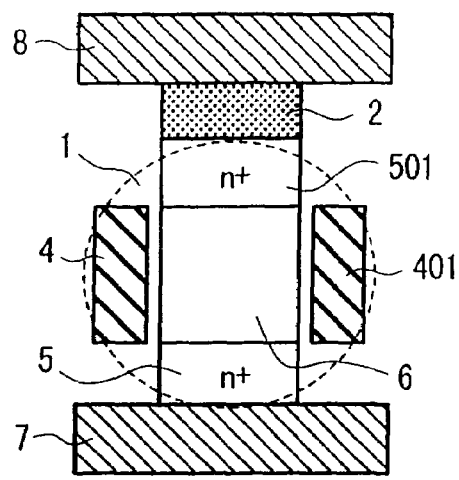
FIG. 1 is the memory cell structure of the present invention.
Figure 2:
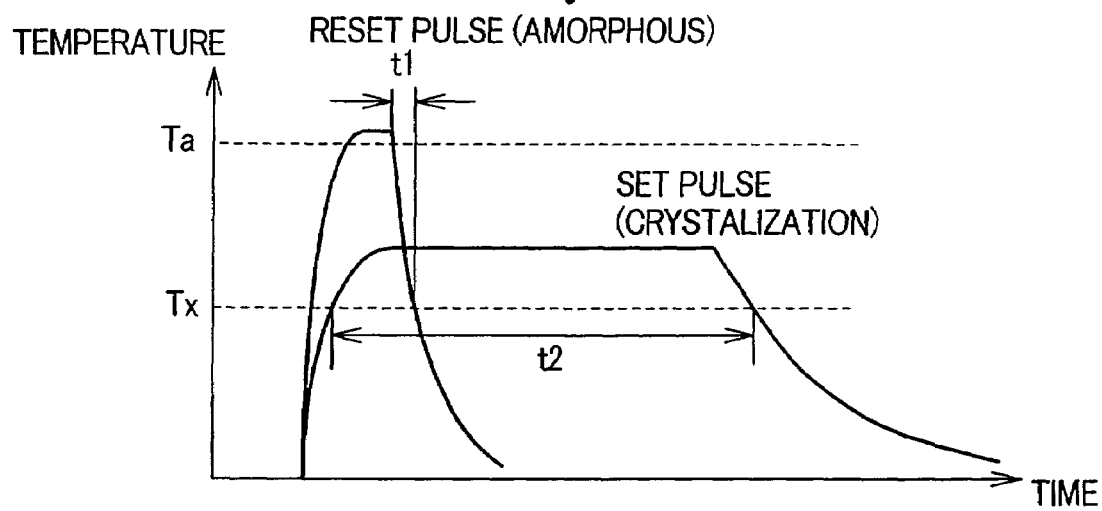
FIG. 2 is a graph showing pulse specifications during changing of the phase state of the chalcogenide.
Figure 3:
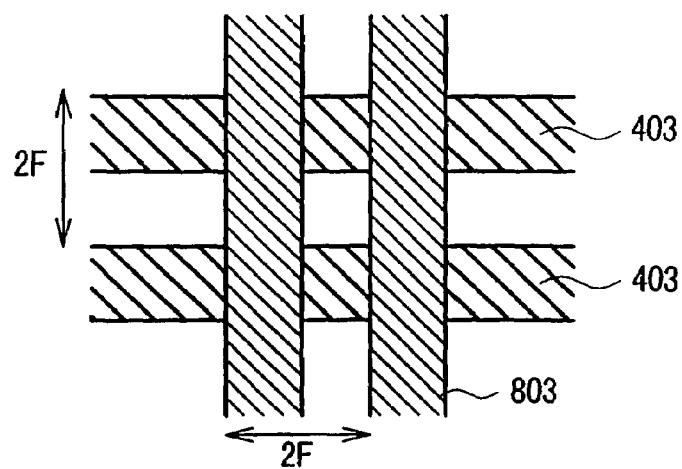
FIG. 3 is a drawing showing the memory cell layout of the first embodiment.

The memory cell forming method of the present invention shown in FIG. 1 is next described in detail while proceeding through the forming process of that method. In the present invention, the first wiring layer (7) and the second wiring layer (8) shown in FIG. 1 can be respectively isolated, rendering the advantage that memory cell operating freedom is expanded.

Figure 4:
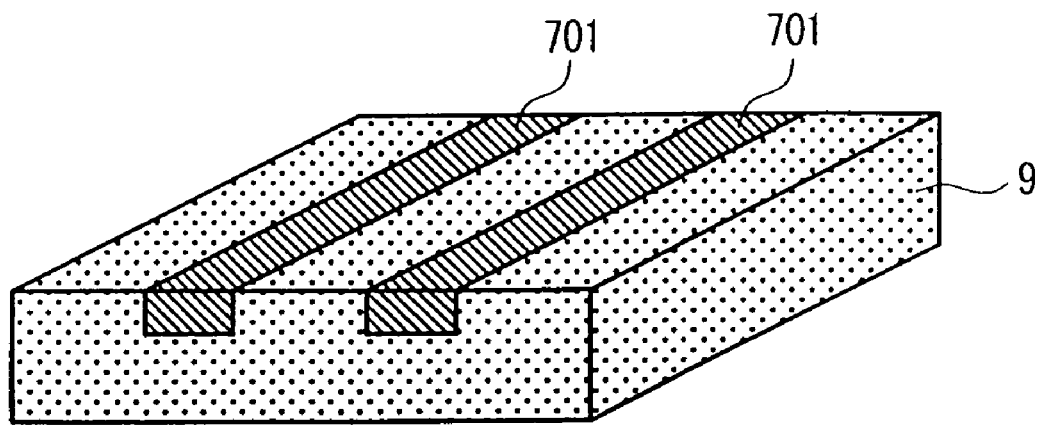
FIG. 4 is an upper perspective view of the first forming process of the semiconductor storage device (memory cell) of the present invention.

A CMOS transistor for peripheral circuits is first of all formed by the usual forming method. An interlayer insulating film (9) is next deposited above it as shown in FIG. 4. After planarizing, a first cell wiring (701) having a pitch of 0.2 microns is formed on the memory cell area and a local interconnect wiring formed on the peripheral circuit area. The present embodiment utilizes tungsten or a tungsten alloy such as W90Ti10 as the wiring material. Of course, a laminated film such as polycrystalline silicon containing a high concentration of impurities or polycrystalline silicon and metal or silicide may also be utilized instead of tungsten or a tungsten alloy such as W90Ti10.

Figure 5:
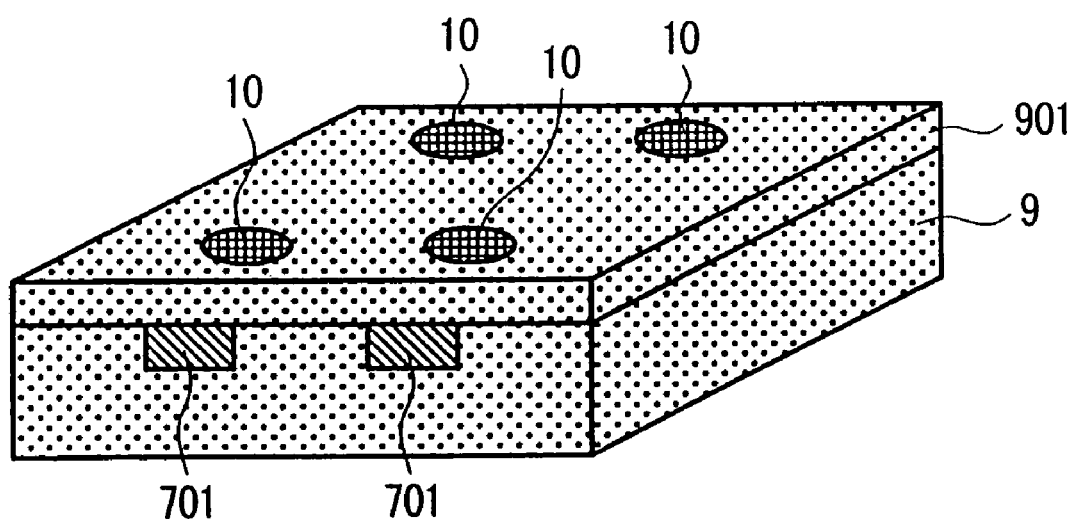
FIG. 5 is an upper perspective view of the first forming process of the semiconductor storage device (memory cell) of the present invention.

Further, an interlayer insulating film (901) of 100 nanometers is deposited, and a polysiliplug (10) containing a high concentration of phosphorus of about $1E20/cm^3$ as the impurity is formed as shown in FIG. 5. A cell wiring (701) and select transistor may be electrically connected by this plug later. Of course, metal or silicide may be utilized instead of this polycrystalline silicon.

The vertical transistor is formed next. Here, the film is formed in the following sequence.

Figure 6:
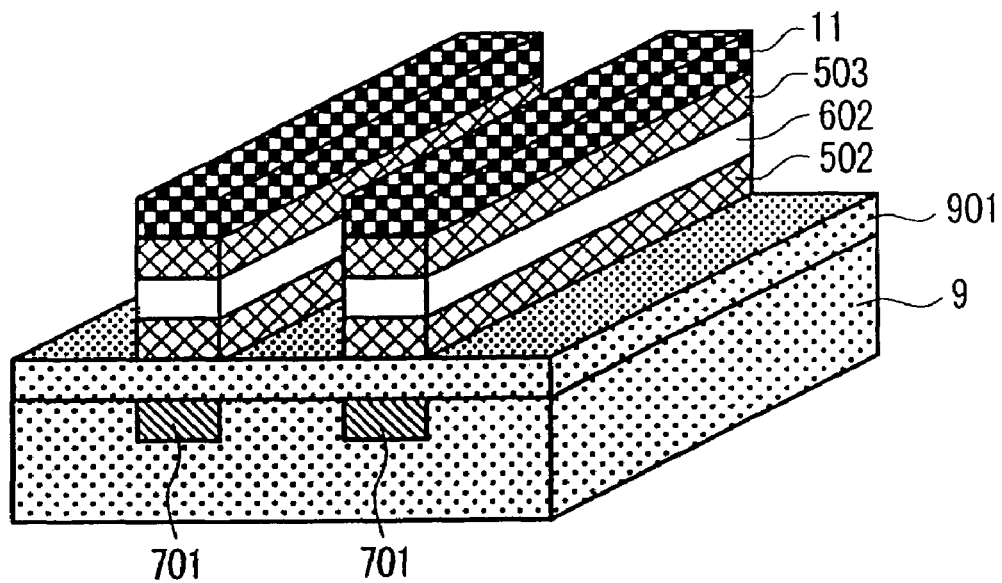
FIG. 6 is an upper perspective view of the first forming process of the semiconductor storage device (memory cell) of the present invention.

An N+ layer (502) doped with a high concentration of phosphorus to about $1E20/cm^3$ (concentration) as the impurity is deposited to form the vertical transistor diffusion layer. An impurity layer (602) containing boron to an extent of about $1E16/cm^3$ as the impurity is deposited to form the channel layer. Further, an N+ layer (503) doped to about $1E20/cm^3$ with a high concentration of phosphorus as the impurity forms the diffusion layer. These layers form the transistor. An insulating film with a thickness of one nanometer may be formed between the channel section (602) and the diffusion layers (502 and 503) to inhibit the diffusion of impurities into the channel section (602) from the impurity diffusion layers (502 and 503). Silicon oxidized film or silicon nitrided film may be utilized in the insulating film. Heat processing is then performed to improve the crystallization characteristics of the silicon. In this case of course, an even more satisfactory crystal can be achieved by utilizing a method such as laser annealing. Needless to say, the transistor performance is also improved in this case. Further, 100 nanometers of silicon nitrided film (11) is deposited as a stopper film for the interlayer film planarizing process (CMP: Chemical Mechanical Polishing) performed later. This laminated film is processed to a line-and-space state at a pitch of 0.2 microns as shown in FIG. 6.

Figure 7:
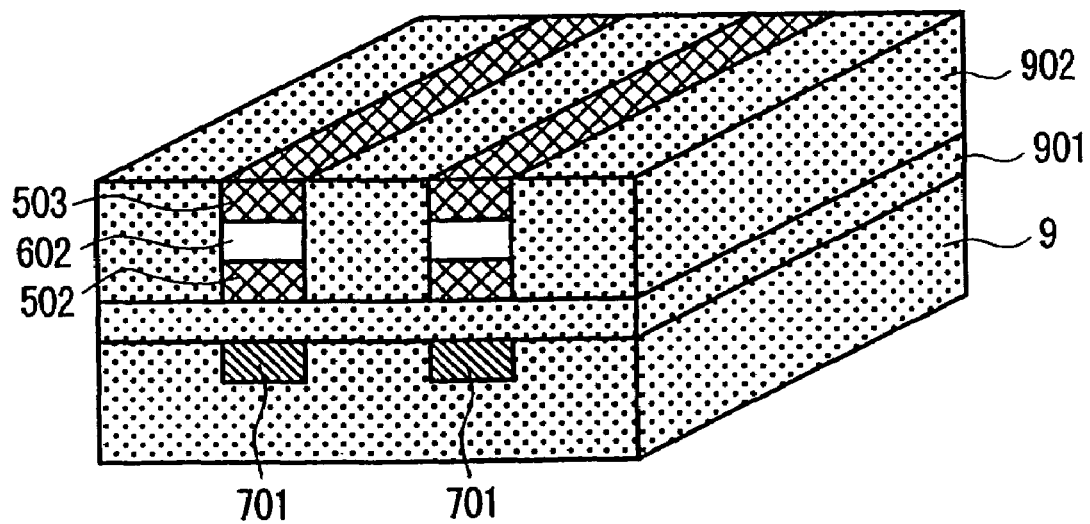
FIG. 7 is an upper perspective view of the first forming process of the semiconductor storage device (memory cell) of the present invention.

The interlayer insulating film (902) is next deposited, and planarizing performed by CMP. The lower polycrystalline silicon (503) is then exposed by removing the silicon nitride film used for processing. The state at this time is shown in FIG. 7.

Figure 8:
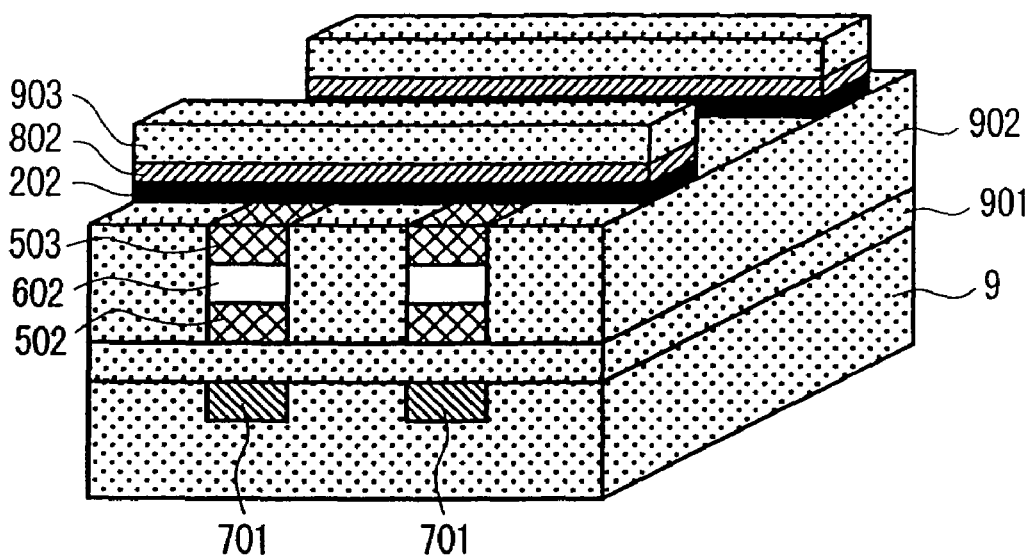
FIG. 8 is an upper perspective view of the first forming process of the semiconductor storage device (memory cell) of the present invention.

Next, chalcogenide material (202) in a film thickness of 50 nanometers and a second cell wiring (802) of tungsten or tungsten alloy such as W90Ti10 in a film thickness of 100 nanometers, as well as an oxidized film (903) in a film thickness of 100 nanometers are deposited. In this case, if a barrier film for example, oxidized compounds or nitrided compounds of a transition metal such as TiAlN, or a metallic conductive film such as W80Ti20 or a combination of these laminated films are deposited between the polycrystalline silicon (503), to prevent diffusion into the polycrystalline silicon (503) of the chalcogenide material (202), then the advantage is obtained that the number of writes (rewrites) can be increased. Or for example, a conductive film with a poor heat propagation rate such as ITO (mixed compound of oxidized tin and indium) can of course be formed in between to limit the diffusion of heat required to change the phase state of the chalcogenide. Next as shown in FIG. 8, these can be formed in a line-and-space state with a pitch of 0.2 microns, in a direction perpendicular to the first wiring (701) that was previously formed. In the present embodiment, the line width was made finer (thinner) with the objective of reducing the capacitance between the second cell wiring (802). More specifically, a light ashing process is performed after exposing the resist pattern and the resist dimensions are made a finer (thinner) 70 nanometers.

Figure 9:
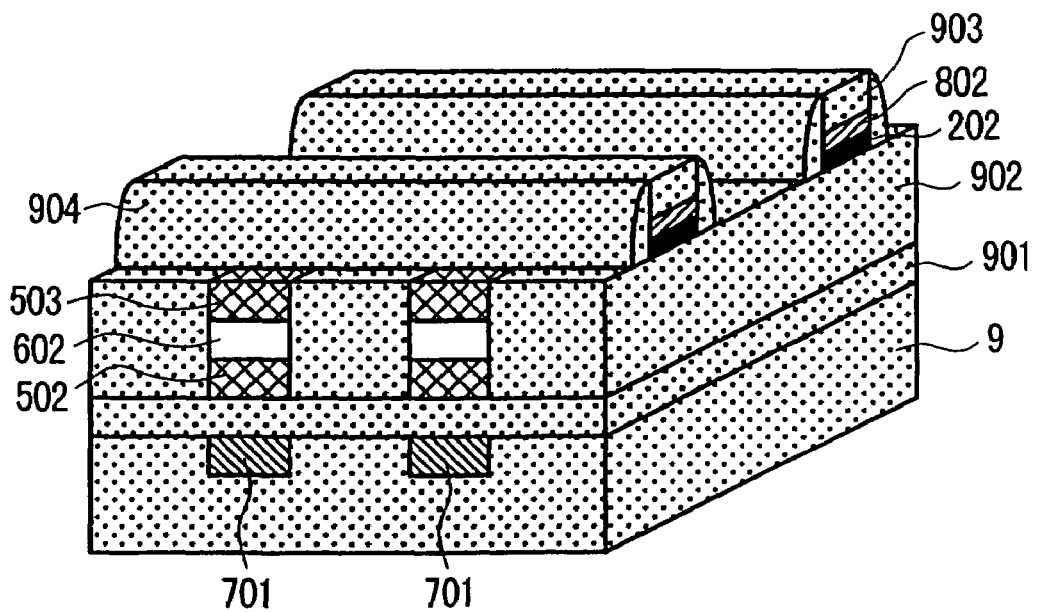
FIG. 9 is an upper perspective view of the first forming process of the semiconductor storage device (memory cell) of the present invention.
Figure 10:
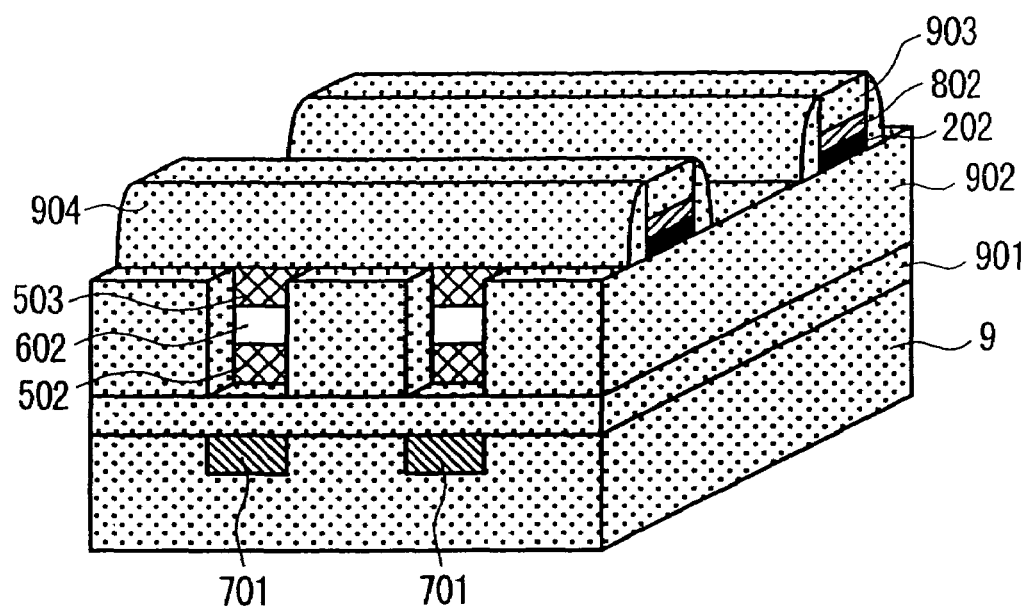
FIG. 10 is an upper perspective view of the first forming process of the semiconductor storage device (memory cell) of the present invention.

Next the select transistor for the word line is formed. First of all, a side wall oxidized film (904) is formed 30 nanometers thick as shown in FIG. 9 with the object of preventing electrical shorts between the word line and the second wiring (802). The chalcogenide (202) is completely covered by the second wiring (802) and the side wall oxidized film (904). The second wiring (802) covered by oxidized film is masked, self-aligning and the lower laminated film of polycrystalline silicon etched to form the structure in FIG. 10.

Figure 11:
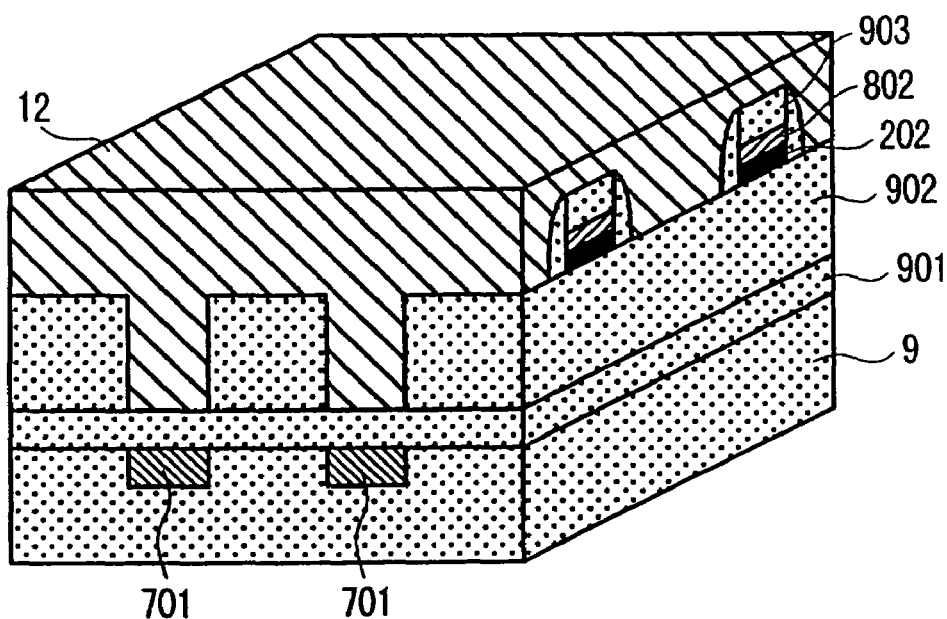
FIG. 11 is an upper perspective view of the first forming process of the semiconductor storage device (memory cell) of the present invention.
Figure 12:
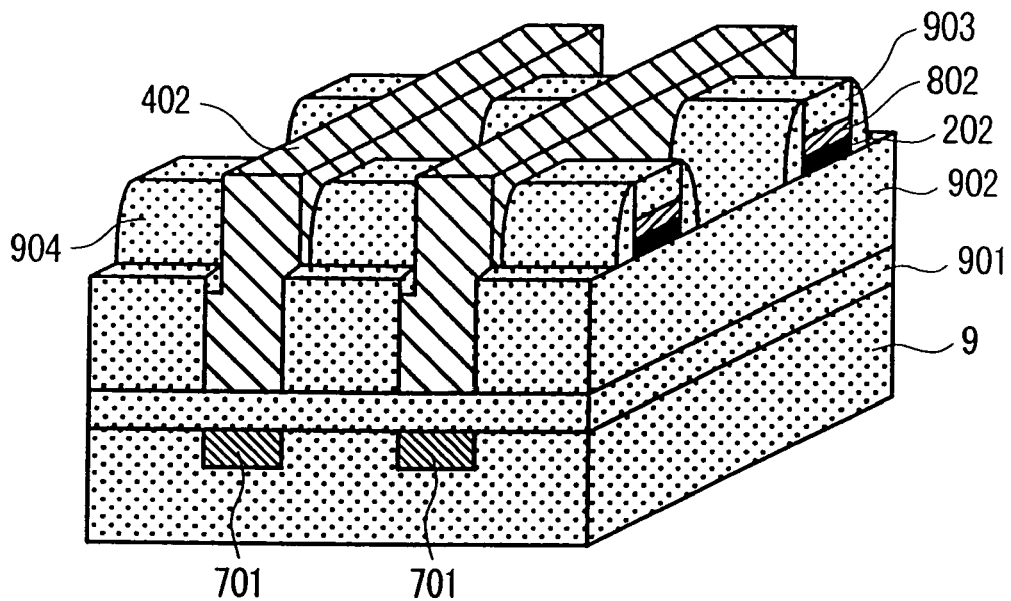
FIG. 12 is an upper perspective view of the first forming process of the semiconductor storage device (memory cell) of the present invention.

Next, a gate oxidized film is formed in a thickness of 10 nanometers by the CVD (carrier vapor deposition) method capable of being performed at a low temperature. The chalcogenide is at this time completely covered just as above so that no sublimation occurs. Therefore gate oxidizing is also possible by heat-oxidizing in higher temperature processes. In the present embodiment, tungsten or a tungsten alloy (12) such as W90Ti10 is deposited and planarized to form the word line as in FIG. 11. The present embodiment utilized tungsten or a tungsten alloy such as W90Ti10 but needless to say, a barrier metal enclosed by tungsten or a tungsten alloy such as W90Ti10 and laminated films of polycrystalline silicon, and polycide may also be utilized. Next, the tungsten or tungsten alloy such as W90Ti10 is processed by the usual dry-etching method into a line-and-space state with a pitch of 0.2 microns and running in a direction perpendicular to the second wiring (802). This state is shown in FIG. 12. During processing of the word lines (402), the electrode material is planarized so that the height in the etching step is formed to match the height of the second cell wiring (802) and the oxidized film (903). The select transistor of the present embodiment in this way forms a double-gate structure with the channel section enclosed from both sides by gate terminals (402). The transistor consequently functions as a complete depletion type SOI (Silicon On Insulator) type and good switching characteristics are achieved.

Finally, the necessary multilayer metallized wiring layer is formed and the desired semiconductor device can be obtained. Thus in the present embodiment, a semiconductor storage device (or memory cell) having a cell surface area approximately half that of a conventional DRAM was achieved by utilizing vertical transistors.

Second Embodiment

Figure 13:
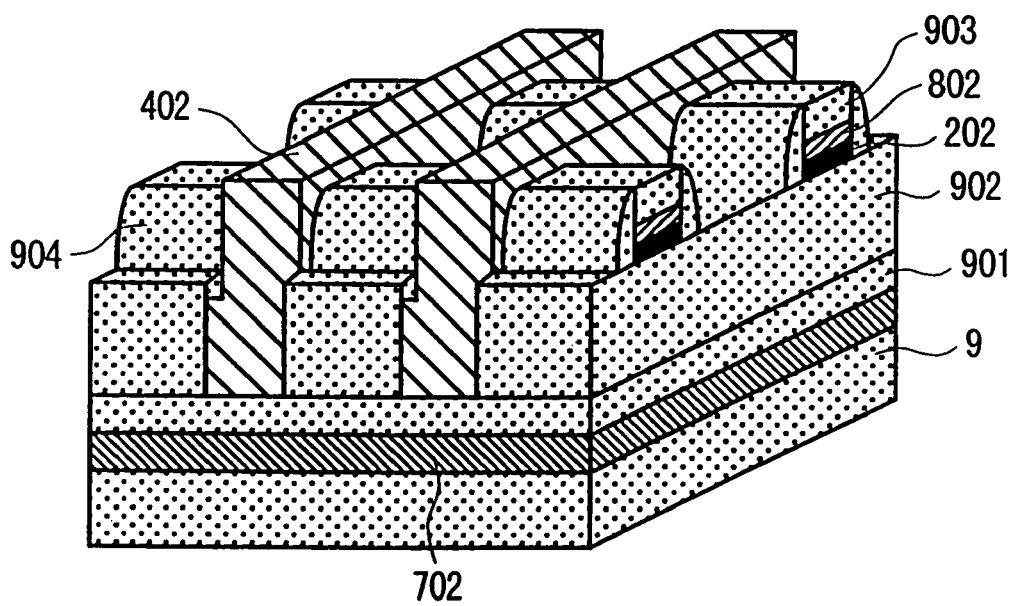
FIG. 13 is an upper perspective view of the first forming process of the semiconductor storage device (memory cell) of the present invention.

In the first embodiment, the first wiring (701) was formed separate for each word line (402) but in the second embodiment, the memory cell structure is not formed with separate first wiring (702). The cell structure of the second embodiment is shown in FIG. 13. The forming method is same as for the first embodiment. This embodiment renders the effect that the voltage potential of the first wiring (702) is stable.

Third Embodiment

Figure 14:
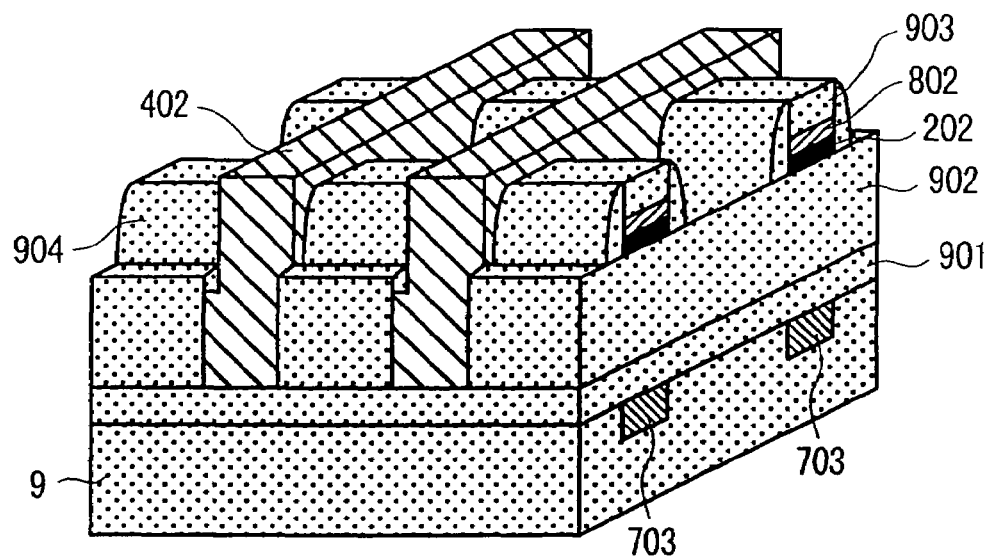
FIG. 14 is an upper perspective view of the first forming process of the semiconductor storage device (memory cell) of the present invention.

The first embodiment has a structure in which the first wiring (701) and the second wiring (802) mutually intersect each other. However a structure in which these are in parallel with each other is clearly possible. The memory cell structure of the third embodiment is shown in FIG. 14. The forming method is same as for the first embodiment. In this structure, the first and second memory cell wiring are in pairs, and memory cells can be selected with these paired lines and word lines.

Fourth Embodiment

In the embodiments 1 through 3, the gate oxidized film was formed after making the chalcogenide material film so the problem existed that the chalcogenide was subjected to high temperatures. As already described in the first embodiment, the heat is not a problem if the material is completely covered at the electrode, etc. A slight volumetric shift does occur however so high temperature processes should be avoided if using chalcogenide material.

Figure 15:
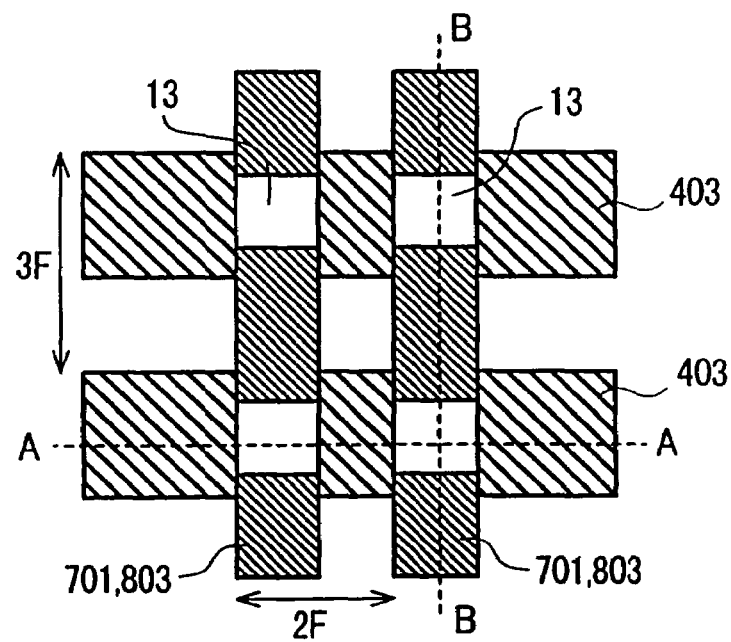
FIG. 15 is a drawing of the memory cell layout of the fourth embodiment.

To achieve this objective (avoid high temperature processes), in this fourth embodiment, the chalcogenide film is formed after forming the gate oxidized film. The memory cell layout of this fourth embodiment is shown in FIG. 15. Though described later on, the cell position pitch differs horizontally (along lines A-A) and vertically (along lines B-B) in order to form self-aligning word lines. In FIG. 15, when F is the minimum processing dimension, then the minimum pitch horizontally (along lines A-A) is 2F and vertically (along lines B-B) is 3F. In other words, the cell surface area is $6F^2$. This layout can of course be optionally set as desired. Needless to say, the memory cell of the present invention is not limited to 6F2.

Figure 16:
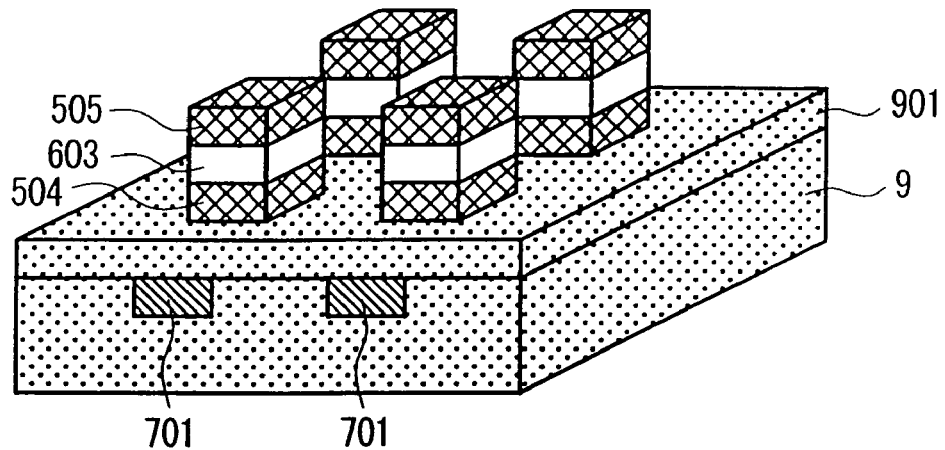
FIG. 16 is an upper perspective view of the first forming process of the semiconductor storage device (memory cell) of the present invention.
Figure 17:
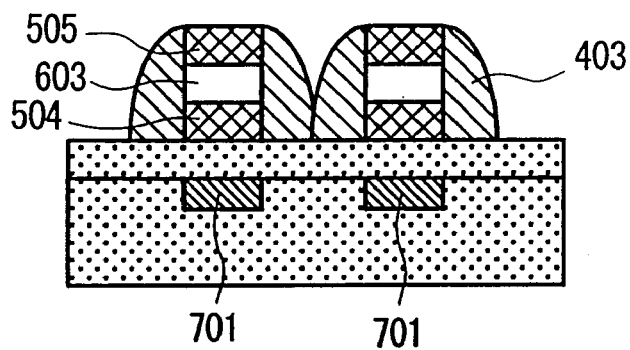
FIG. 17 is a cross sectional view of the first forming process of the semiconductor storage device (memory cell) of the present invention.
Figure 18:
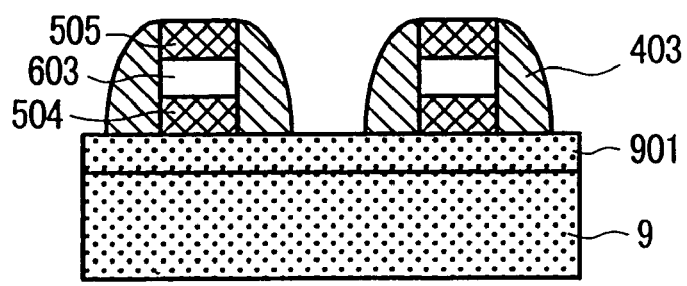
FIG. 18 is a cross sectional view of the first forming process of the semiconductor storage device (memory cell) of the present invention.

The process shown up to FIG. 5 is the same forming process as for the first embodiment. Next, an $N^+$ layer (504) doped with a high concentration of impurities forming the diffusion layer of the vertical transistor, a low concentration impurity layer (603) forming the channel section, and an $N^+$ layer (505) forming a further diffusion layer are deposited and crystallization achieved by the annealing process. The conventional dry etching process is performed to isolate to each memory cell as shown in FIG. 16, and a further gate oxidation film of 10 nanometers is deposited by the CVD (carrier vapor deposition) method. Of course, a gate oxidized film may also be formed by the heat-oxidizing process. Polycrystalline silicon containing a high concentration of impurities is then formed by the usual CVD method and the side wall gate electrode formed by the dry etching process. The respective cross sections along lines (A-A) and (B-B) in FIG. 15 at this time are shown in FIG. 17 and FIG. 18. In other words, the pitch of the memory cell varies so the side wall word electrodes are self-aligning and connected along the direction of (A-A) and are isolated along the (B-B) direction. The technique of self-aligning isolating of the word lines was utilized in the present embodiment however forming may also be performed by the conventional dry etching process utilizing a resist mask, etc.

Figure 19:
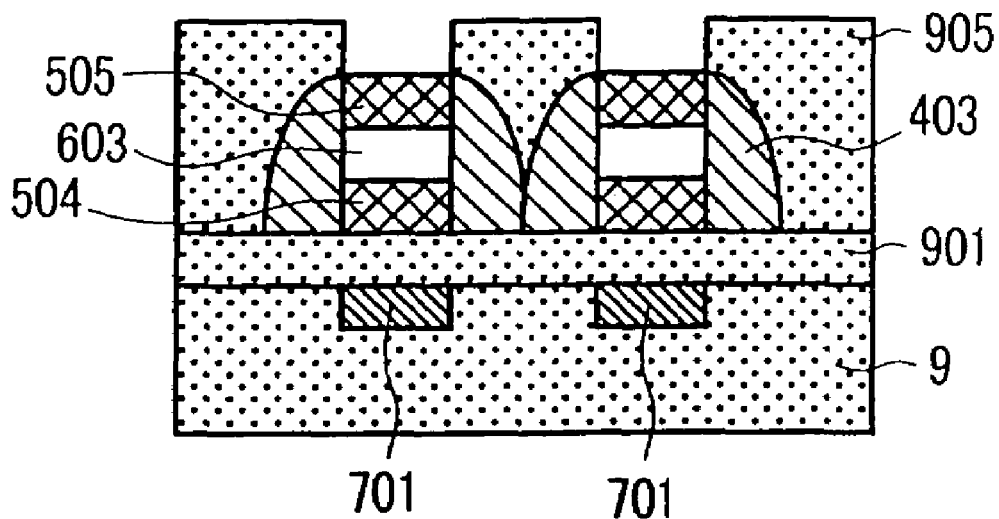
FIG. 19 is a cross sectional view of the first forming process of the semiconductor storage device (memory cell) of the present invention.
Figure 20:
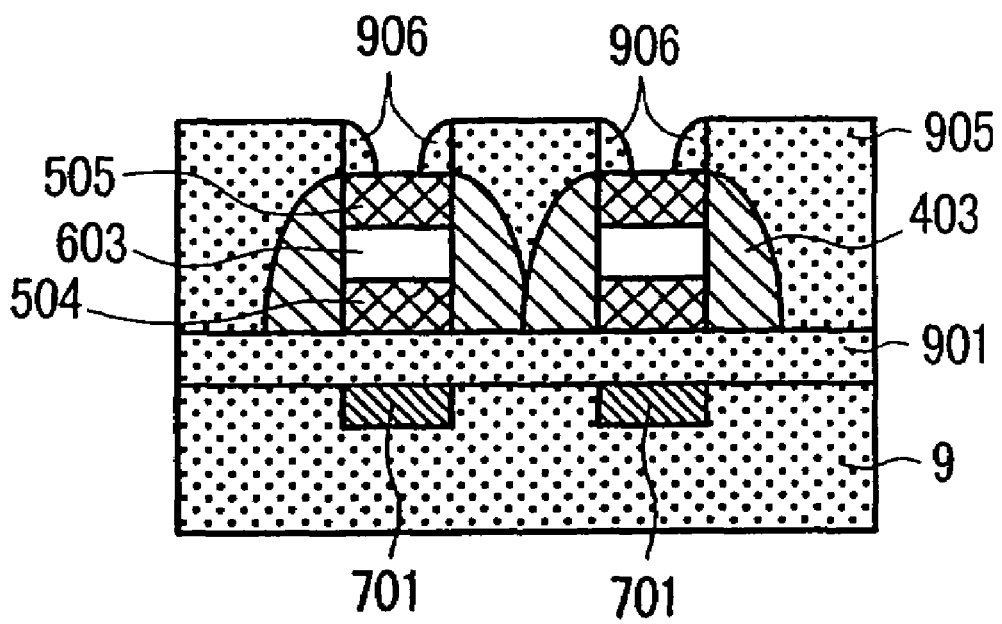
FIG. 20 is a cross sectional view of the first forming process of the semiconductor storage device (memory cell) of the present invention.

An oxidized film of one micron is then deposited by the CVD method of the known art, planarizing performed by a CMP method of the known area, a contact (hole) formed, and the lower layer of polycrystalline silicon exposed to form a structure as shown in the cross section of FIG. 19. An oxidized film of 30 nanometers is next deposited by etchback with the dry etching method and the side wall oxidized film (906) formed as shown in FIG. 20. The reasons for the self-aligning contraction of the contact dimensions are as follows. Heat must be applied in order to change the phase of the chalcogenide. The resistance of the chalcogenide must be increased to some extent to efficiently raise the temperature of the chalcogenide. This is important for low voltage operation. To achieve this (low voltage operation), reducing the contact surface area of the chalcogenide with the diffusion layer of the select transistor will prove effective. So the technique of self-aligning shrinking of the contact dimensions was used for these reasons.

Figure 21:
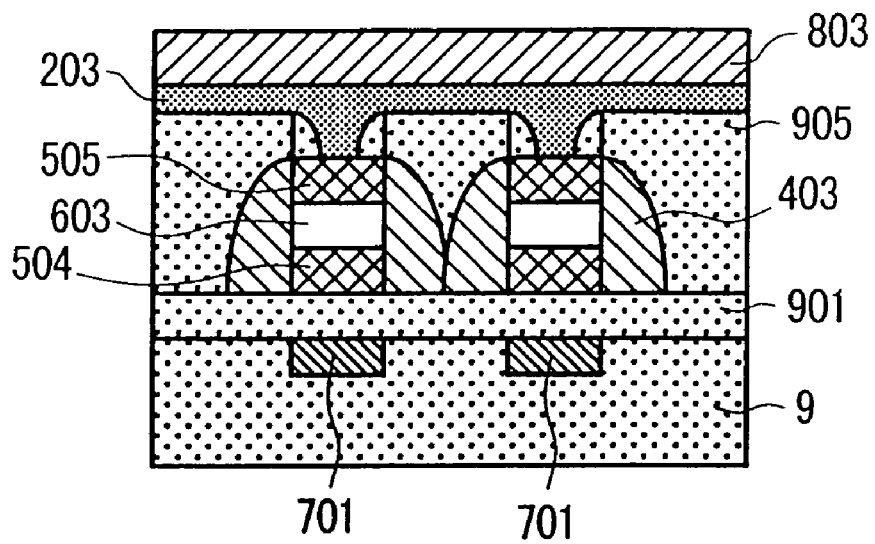
FIG. 21 is a cross sectional view of the first forming process of the semiconductor storage device (memory cell) of the present invention.

The chalcogenide material (203) and the second wiring (803) of tungsten or tungsten alloy such as W90Ti10 are then deposited as shown in FIG. 21. Depositing a barrier film for example, oxidized compounds or nitrided compounds of a transition metal such as TiAlN, or a metallic conductive film such as W80Ti20 or a combination of these laminated films before the chalcogenide material layer, has the advantage that the number of writes (rewrites) can be increased. A conductive film for example with a poor heat propagation rate such as ITO (mixed compound of oxidized tin and indium) can of course be formed in between to limit the diffusion of heat required to change the phase state of the chalcogenide. The memory cell operation is just as shown in FIG. 21. In other words, the second wiring (803) is a jointly shared line, and the first wiring (701) is the data line. This has the advantage that chalcogenide processing is not required. The heat generated during changing of the phase state can be effectively avoided by forming the second wiring (803) in a planarized state and one effect of eliminating the effect of the heat history is that stable operation is achieved. The effect on memory cell operation is that stable voltage potential is achieved by one layer of second wiring (803).

Figure 22:
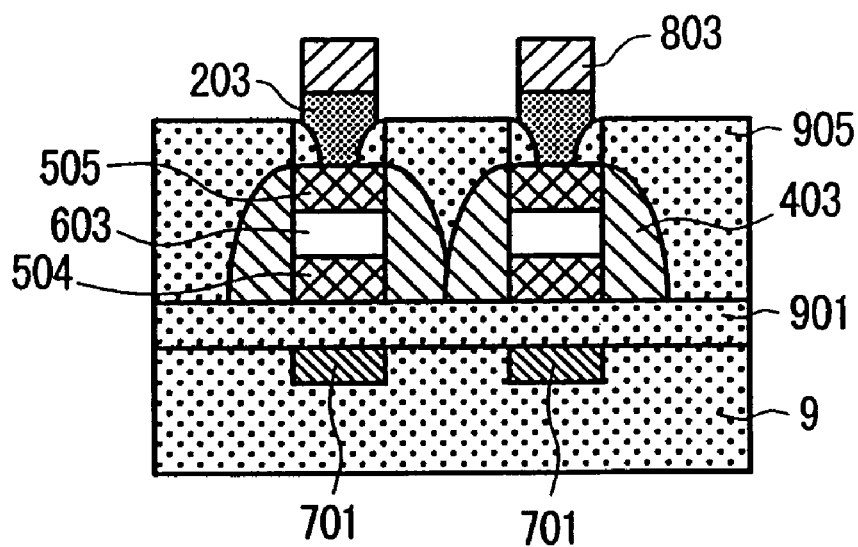
FIG. 22 is a cross sectional view of the first forming process of the semiconductor storage device (memory cell) of the present invention.

The second wiring (803) can of course also be separated. In this case it can be separated in a direction parallel with tungsten or a tungsten alloy such as W90Ti10 by dry etching as shown in FIG. 22.

Finally, the required multilayer metallized wiring layer is formed and the desired semiconductor storage device (memory cell) can be obtained.

Fifth Embodiment

In the fourth embodiment, reducing the contact surface area of the select transistor with the chalcogenide material was described as effective in reducing the operating voltage. This is also applicable to the structures related for the first through third embodiments. Methods for achieving this (smaller contact area) are described next while referring to the drawings.

Figure 23:
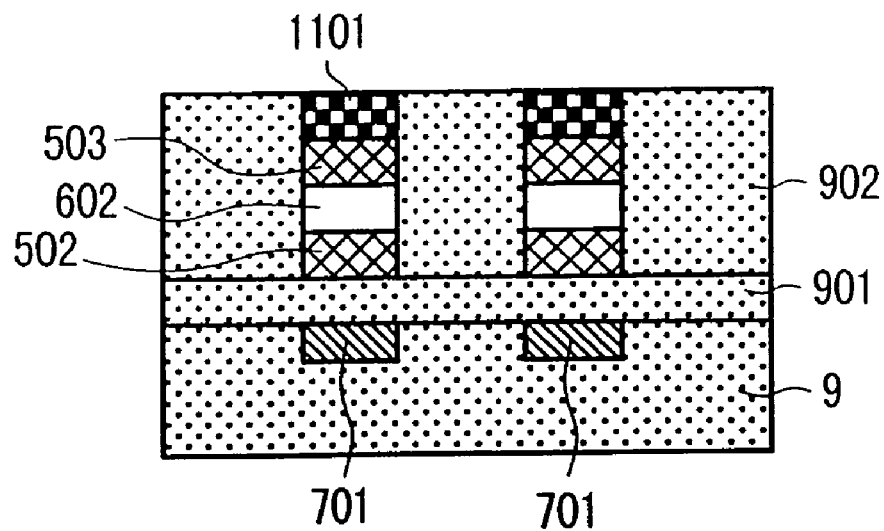
FIG. 23 is a cross sectional view of the first forming process of the semiconductor storage device (memory cell) of the present invention.
Figure 24:
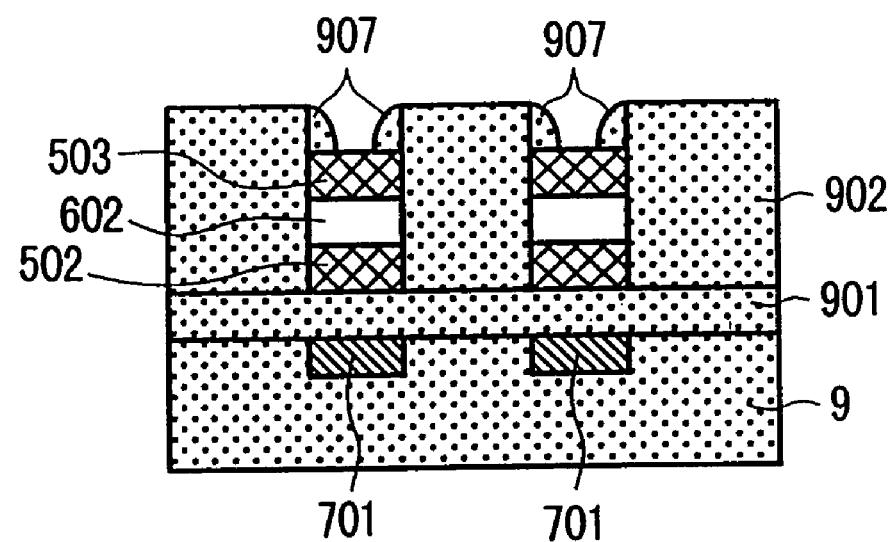
FIG. 24 is a cross sectional view of the first forming process of the semiconductor storage device (memory cell) of the present invention.

In FIG. 6 the forming method is the same as the first embodiment. Next, and interlayer insulating film (902) is deposited, planarizing is performed by CMP and the lower layer of silicon nitrided film exposed as shown in FIG. 23. The silicon nitrided film is removed by wet processing using heated phosphoric acid, 30 nanometers of silicon oxidized film deposited by the conventional CVD method, a side wall oxidized film (907) formed by the etch back process as shown in FIG. 24. The contact dimensions were in this way self-aligned and shrunk (reduced). In this embodiment the side wall film was formed of ordinary silicon oxidized film but porous oxidized film with a poor heat conduction rate may also be utilized. Efficiency is good in this case, since the diffusion of the heat required for changing the phase of the chalcogenide can be prevented and changing of the phase state can be achieved. Germanium oxide (GeO.sup.2) is also suitable as a material for achieving this same objective.

Figure 25:
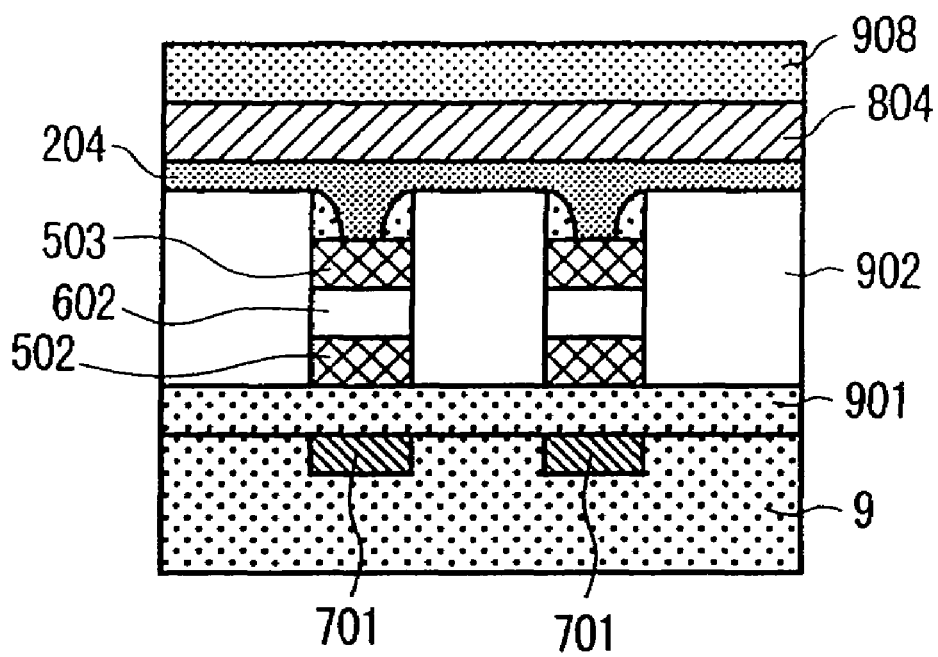
FIG. 25 is a cross sectional view of the first forming process of the semiconductor storage device (memory cell) of the present invention.

The chalcogenide material (204) and the second wiring (804) of tungsten or tungsten alloy such as W90Ti10 and further a oxidized film (908) are then deposited as shown in FIG. 25. Depositing a barrier film for example, oxidized compounds or nitrided compounds of a transition metal such as TiAlN, or a metallic conductive film such as W80Ti20 or a combination of these laminated films before the chalcogenide material layer, has the advantage that the number of writes (rewrites) can be increased. A conductive film for example with a poor heat conduction rate such as ITO (mixed compound of oxidized tin and indium) can of course be formed in between to limit the diffusion of heat required to change the phase state of the chalcogenide. Hereafter, multilayer metallic wiring layers that are further required are formed in the same forming methods as in FIG. 8 through FIG. 12, and the desired semiconductor device is obtained.

Sixth Embodiment

In the embodiment up until now, the select transistor was composed of polycrystalline silicon to simplify the forming process. The select transistor can of course also be comprised from within the silicon substrate. Such a case has the advantage that characteristics are better than a transistor made of polycrystalline silicon. In this embodiment, a silicon substrate developed epitaxially is utilized. The forming method is described next while referring to the drawings.

Figure 26:
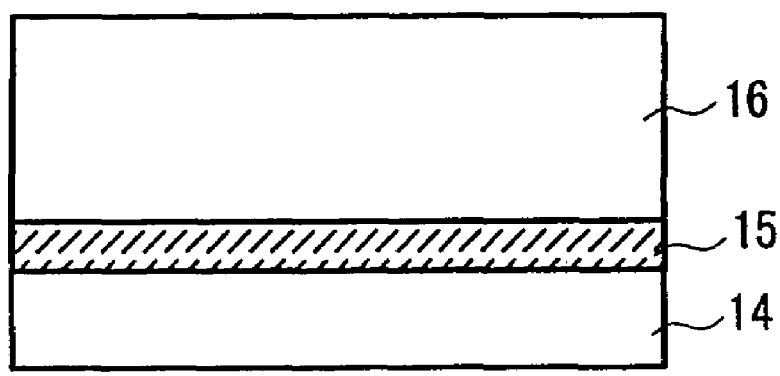
FIG. 26 is a cross sectional view of the first forming process of the semiconductor storage device (memory cell) of the present invention.
Figure 27:
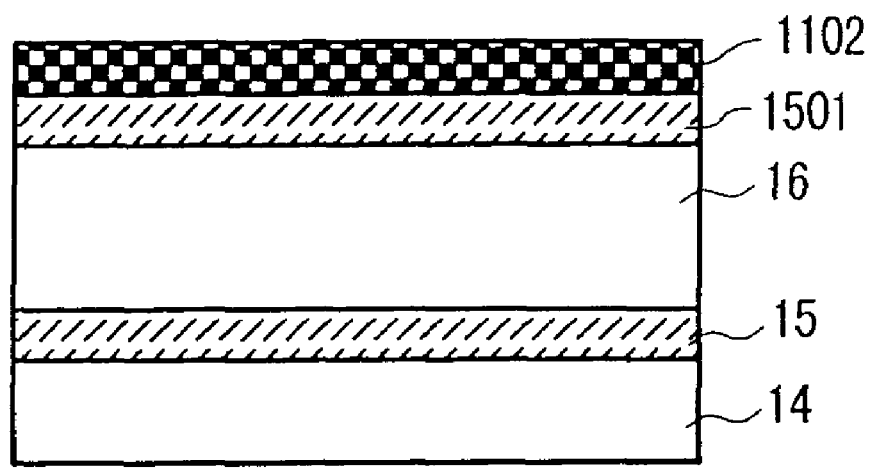
FIG. 27 is a cross sectional view of the first forming process of the semiconductor storage device (memory cell) of the present invention.
Figure 28:
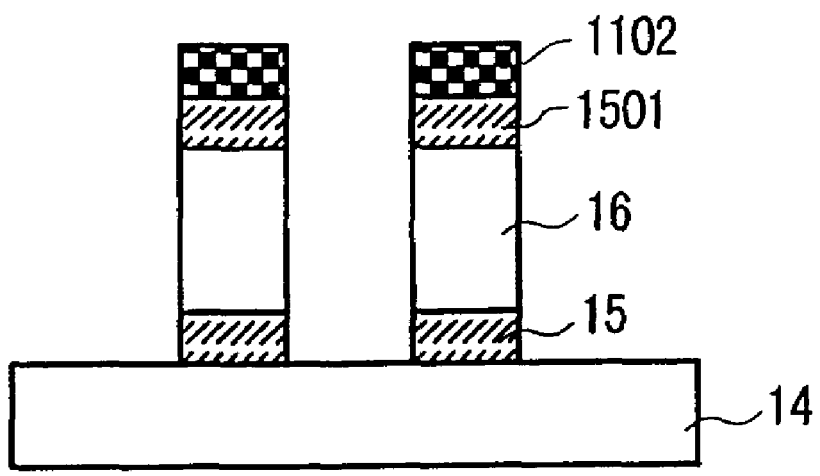
FIG. 28 is a cross sectional view of the first forming process of the semiconductor storage device (memory cell) of the present invention.
Figure 29:
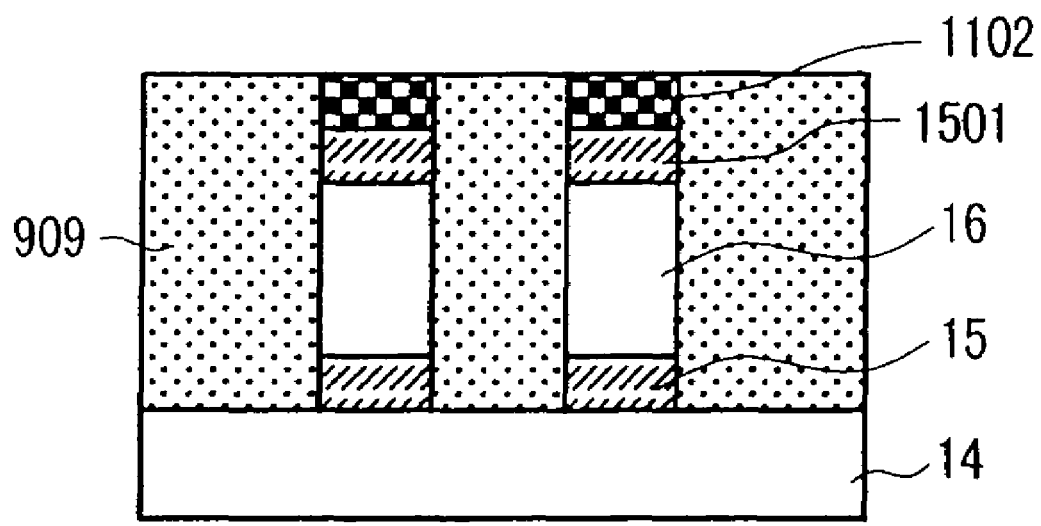
FIG. 29 is a cross sectional view of the first forming process of the semiconductor storage device (memory cell) of the present invention.
Figure 30:
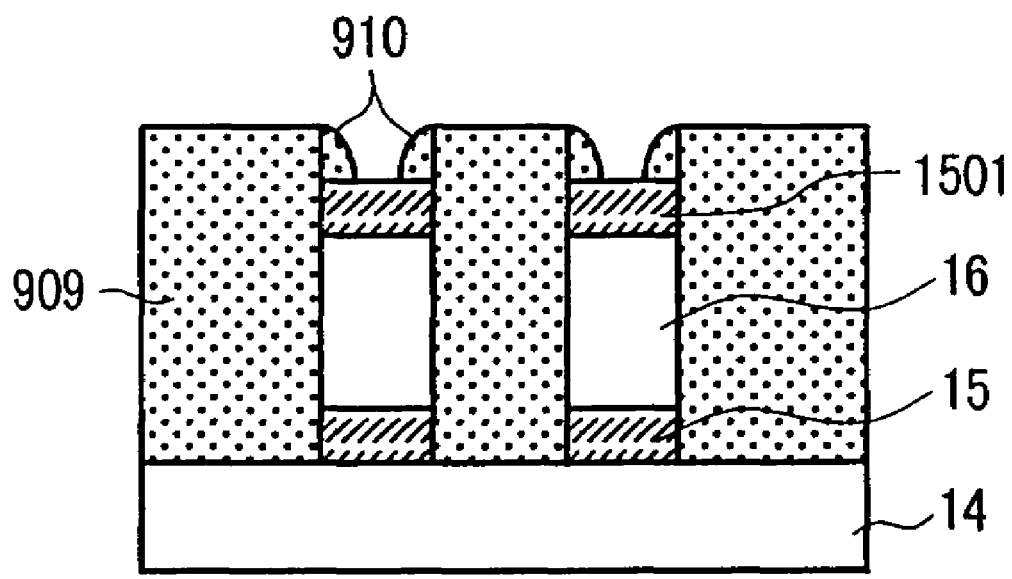
FIG. 30 is a cross sectional view of the first forming process of the semiconductor storage device (memory cell) of the present invention.
Figure 31:
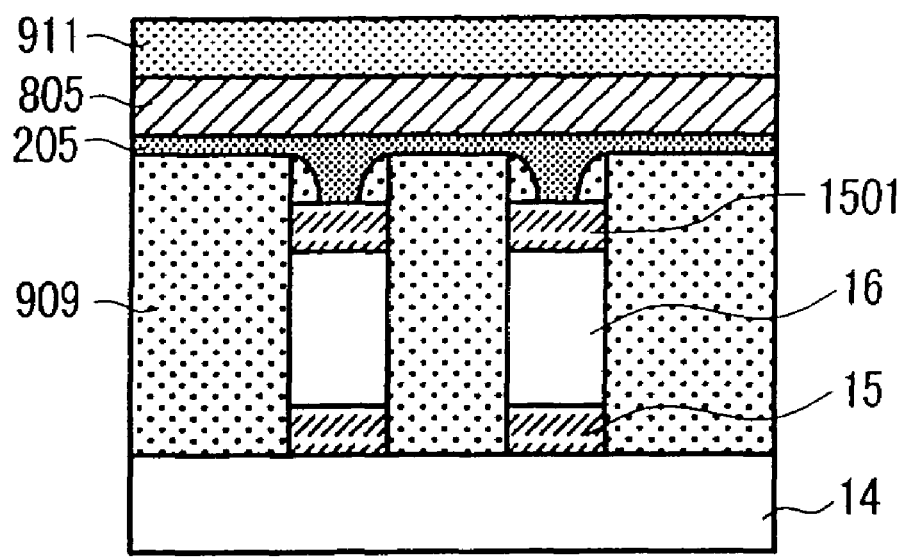
FIG. 31 is a cross sectional view of the first forming process of the semiconductor storage device (memory cell) of the present invention.

A p-type semiconductor substrate is prepared, antimony (Sb) is administered in a dose of 1E20/cm.sup.3, and developed epitaxially. Of course, arsenic (As) or phosphorus (P) may also be used instead of antimony. A substrate formed internally of a high concentration n-type impurity layer (15) can consequently be obtained as shown in FIG. 26. This high concentration n-type impurity layer (15) is the diffusion layer for the select transistor. Next, a 1E20/cm.sup.3 dose of arsenic is injected and activation achieved by annealing. This forms the other diffusion layer of the select transistor. A silicon nitrided layer (1102) is deposited to 100 nanometers as a stopper film as shown in FIG. 27 by an interlayer film planarizing process (CMP: Chemical Mechanical Polishing) performed later. Next, as shown in FIG. 28, a conventional dry etching process is performed to carve the layers into separate stick shapes, at a 0.2 micron pitch, with line-and-space shapes up to the embedded impurity compound diffusion layer (15). This process is the same as in FIG. 6 of the first embodiment. An interlayer insulating film (909) is deposited, planarizing performed by CMP, and further, the silicon nitrided layers (1102) for processing are exposed as shown in FIG. 29. Following this, the silicon nitrided layer (1102) is removed and the lower layer, impurity compound diffusion layer (1501) is exposed. Further, an oxidized film of 30 nanometers is deposited, etch back by dry etching performed, an a side wall oxidized film (910) formed as shown in FIG. 30 with the object of reducing the contact surface area between the diffusion layer of the select transistor and the chalcogenide. Next the chalcogenide material (205) and the second cell wiring (805) of tungsten or tungsten alloy such as W90Ti10 and a further oxidized film (911) are formed as shown in FIG. 31.

Figure 32:
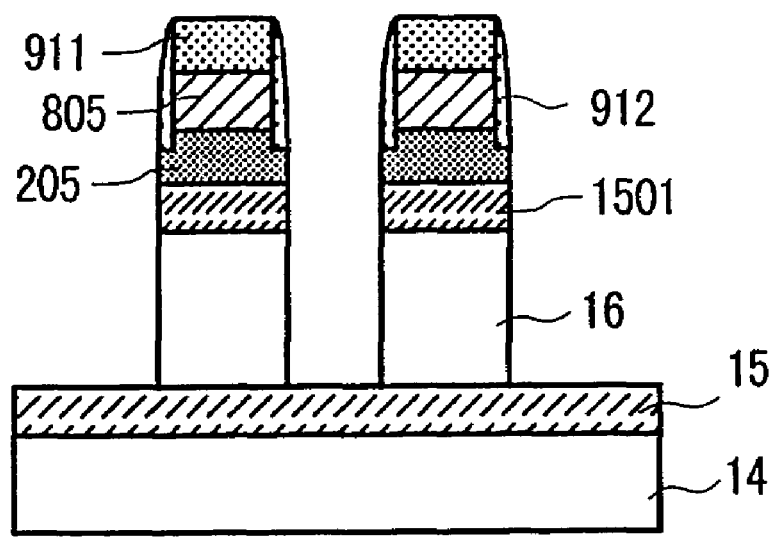
FIG. 32 is a cross sectional view of the first forming process of the semiconductor storage device (memory cell) of the present invention.

Depositing a barrier film for example, oxidized compounds or nitrided compounds of a transition metal such as TiAlN, or a metallic conductive film such as W80Ti20 or a combination of these laminated films before the chalcogenide material layer, has the advantage that the number of writes (rewrites) can be increased. A conductive film for example with a poor heat conduction rate such as ITO (mixed compound of oxidized tin and indium) can of course be formed in between to limit the diffusion of heat required to change the phase state of the chalcogenide. Next, a laminated film composed of an oxidized film (911), a second cell wiring (805) and chalcogenide material (205) is formed perpendicular to the pattern formed in FIG. 28 in line-and-space shapes by the usual dry-etching process. Further, 30 nanometers of oxidized film is deposited, and a side wall oxidized film (912) formed by the etch back process to prevent electrical shorts between the second cell wiring (805) and the word line formed later on. Next, the lower layer, impurity compound diffusion layer (1501) and the epitaxially developed section (16) are completely isolated by dry etching, and processing along the impurity compound diffusion layer (15) stopped as shown in FIG. 32. A cross section along a direction perpendicular to second cell wiring (805) is shown in FIG. 32. Finally a multilayer metallic wiring layer is formed byway of the processes shown from FIG. 11 through FIG. 12 of the first embodiment, and the desired semiconductor storage device (memory cell) is obtained.

Figure 33:
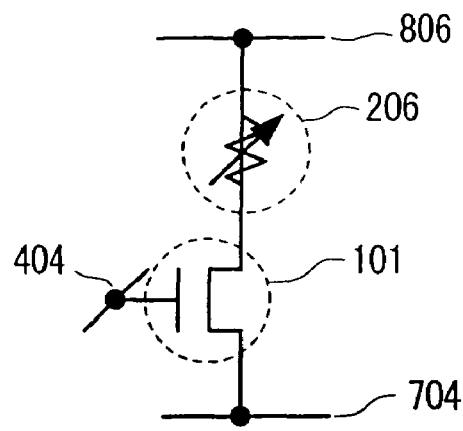
FIG. 33 is a circuit equivalent to the semiconductor storage device (memory cell) of the present invention.
Figure 34:
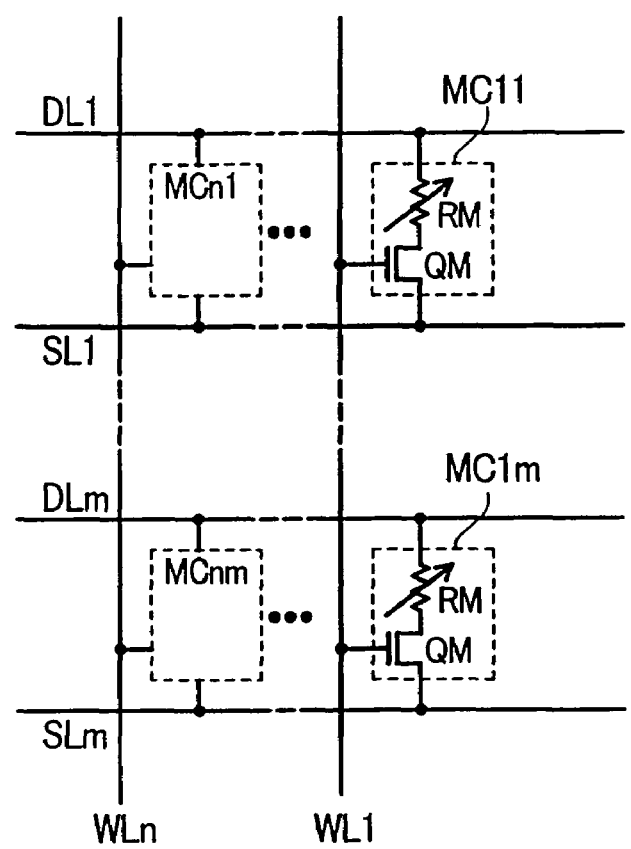
FIG. 34 is a memory array utilized in the semiconductor storage device (memory cell) of the present invention.

Further, a memory array as shown in FIG. 34 can be formed by utilizing a memory cell composed of a circuit equivalent to that in FIG. 33 of the invention. A first cell select line (704) equivalent to a source line and in parallel with a second cell line (806) equivalent to a data line are formed in this array. By utilizing a configuration where the source of the select transistor within the memory cell is connected to a corresponding source line, the power consumption required for readout operation can be reduced. More specifically, just the source line (for example, SL1) corresponding to the desired data line (for example, DL1) to be selected, can be driven by a source voltage (for example, 0.5 volts). Next, the select word line (for example, WL1) is driven from a non-select status of 0 volts, to a high voltage select status (for example. 1.5 volts). An electrical current path is therefore formed only to the cell MC11 at an intersecting point of (for example, WL1) and the select data line (for example, DL1), and a read-out signal can be generated just for the select data line. The charging and discharging of a large number of non-select data lines is therefore eliminated and the power consumption for read-out can be reduced.

The same select operation is performed for the read-out operation and for the write operation so that a phase change (Ovonic) memory with overall low power consumption can be achieved.

The present invention is characterized in that the cell surface area can be reduced to an area smaller than a DRAM of the related art, by configuring a memory cell of vertical shift transistors utilizing phase change material. Another effect of the invention is that power consumption is reduced in read-out operation. Yet another effect rendered by the invention is that a phase change (Ovonic) memory with overall low power consumption can be achieved since the same select operation is performed for the read-out operation and for the write operation.

What is claimed is:

1. A semiconductor manufacturing method comprising:
    forming a first diffusion layer within a semiconductor substrate;
    forming a second diffusion layer over the first diffusion layer within the semiconductor substrate, the second diffusion layer being which is the same conductive type as the first diffusion layer;
    forming stick shapes extending in a first direction by etching the semiconductor substrate including the first and second diffusion layer;
    forming oxide layers between the stick shapes extending in the first direction; and
    forming a storage layer over the stick shapes extending in the first direction and the oxide layers, the storage layer being electrically connected to the second diffusion layer.

2. A semiconductor manufacturing method according to claim 1, further comprising:
    forming stick shapes extending in a second direction across the first direction by etching the storage layer, the stick shapes extending in the first direction, and the oxide layers; and
    forming word lines between the stick shapes extending in the second direction.

3. A semiconductor manufacturing method according to claim 2,
    wherein in forming stick shapes extending in the second direction, the first diffusion layer is left so as to connect to the first diffusion layer including the neighboring stick shape.

4. A semiconductor manufacturing method according to claim 1, further comprising;
    forming a nitride layer over the second diffusion layer before forming the stick shapes extending in the first direction as a stopper film of CMP process.

5. A semiconductor manufacturing method according to claim 1,
    wherein the semiconductor substrate is made by epitaxial growth.

6. A semiconductor manufacturing method according to claim 1,
    wherein the storage layer includes a chalcogenide material.

* * * * *